United States Patent
Karpur et al.

(10) Patent No.: US 12,493,061 B2
(45) Date of Patent: Dec. 9, 2025

(54) BIDIRECTIONAL CURRENT SENSE FOR POWER FIELD-EFFECT TRANSISTOR

(71) Applicant: Infineon Technologies Canada Inc., Ottawa (CA)

(72) Inventors: Ramesh G. Karpur, Bangalore (IN); Abhisek Jain, Delhi (IN); Lucas Andrew Milner, Sunnyvale, CA (US); Nan Xing, Allen, TX (US); Ashutosh Ravindra Joharapurkar, Bangalore (IN); Zhemin Zhang, Allen, TX (US); Krishnaswamy Nagaraj, Ashburn, VA (US)

(73) Assignee: Infineon Technologies Canada Inc., Ottawa (CA)

( * ) Notice: Subject to any disclaimer, the term of this patent is extended or adjusted under 35 U.S.C. 154(b) by 147 days.

(21) Appl. No.: 18/423,069

(22) Filed: Jan. 25, 2024

(65) Prior Publication Data

US 2025/0244365 A1    Jul. 31, 2025

(51) Int. Cl.
*G01R 19/00* (2006.01)
(52) U.S. Cl.
CPC ................................ *G01R 19/0092* (2013.01)

(58) Field of Classification Search
CPC .................................................. G01R 19/0092
See application file for complete search history.

(56) References Cited

U.S. PATENT DOCUMENTS

| | | | |
|---|---|---|---|
| 10,862,443 B2 * | 12/2020 | Raimar | H03G 3/30 |
| 10,962,574 B2 * | 3/2021 | Zhou | H03H 7/06 |
| 2021/0005587 A1 * | 1/2021 | Joardar | H10D 62/116 |
| 2025/0076909 A1 * | 3/2025 | Guduri | H03K 17/102 |
| 2025/0180609 A1 * | 6/2025 | Dabbagh Sadeghipour | G01R 19/16552 |

* cited by examiner

*Primary Examiner* — Dominic E Hawkins
(74) *Attorney, Agent, or Firm* — WORKMAN NYDEGGER

(57) ABSTRACT

A bidirectional current sense circuit allowing for sensing of power current passing through a power field-effect transistor, regardless of the direction of the power current. The bidirectional current sense circuit outputs a current sense signal representing the power current onto a current sense output node. The bidirectional current sense circuit includes the power field-effect transistor, and two current sense circuits. One of the current sense circuits senses the power current when the power current flows in the positive direction. The other current sense circuit senses the power current when the power current flows in the negative direction.

11 Claims, 3 Drawing Sheets

BIDIRECTIONAL CURRENT SENSE FOR POWER FIELD-EFFECT TRANSISTOR

BACKGROUND

Electronic circuits typically include transistors, which function as electronic switches that regulate or control current flow in portions of the circuit. One type of transistor is a field-effect transistor in which a voltage is applied to a gate terminal to turn the transistor on and off. A semiconductor channel region is disposed between the drain terminal and the source terminal. When the transistor is on, current flows through the semiconductor channel region between the drain terminal and the source terminal. When the transistor is off, lesser or no current flows through the semiconductor channel region between the drain terminal and the source terminal. The gate terminal is disposed over the semiconductor channel region between the source terminal and the drain terminal. Voltage on the gate terminal generates a field that affects whether the semiconductor channel region conducts current-hence the term "field-effect transistor".

Silicon has traditionally been used to fabricate transistors. However, wider bandgap semiconductor material may be used to fabricate transistors that conduct higher power and operate at higher efficiency than silicon transistors. Silicon-Carbide (SiC), Aluminum-Nitride (AlN), Zinc-Oxide (ZnO), and Gallium-Nitride (GaN) are each examples of wide bandgap semiconductor materials that can be used in power electronics. One way to use such wider bandgap semiconductor materials is to form two layers of different semiconductor materials to therebetween form a heterojunction.

These two semiconductor materials may have sufficiently different bandgaps such that when brought together, the joined bandgap drops below the Fermi level just within the channel layer. This means that electrons may freely flow within this region. This region is thin in depth and forms a plane parallel to the upper surface of the channel region. Thus, this region is called a "2DEG" region to emphasize its planar form. Furthermore, this region is also referred to as a 2DEG "sea of electrons" due to the high mobility of electrons in this region. Thus, the 2DEG region is highly conductive. The 2DEG region may form the channel region of a power semiconductor to allow passage of high currents with relatively low resistance. Field-effect transistors that use such a 2DEG are referred to as "High-Electron-Mobility Transistors" (or HEMTs).

Some HEMTs may be used for amplifying and switching purposes in high-power circuits, and thus may be sometimes referred to as "power transistors". Power transistors can typically operate with currents greater than 1 amp to as much as hundreds of amps. Further, power transistors may convey power greater than 1 watt to as many as hundreds of watts or even greater. Nonetheless, measurement of current passing through a power transistor can be beneficial.

The subject matter claimed herein is not limited to embodiments that solve any disadvantages or that operate only in environments such as those described above. Rather, this background is only provided to illustrate one example technology area where some embodiments described herein may be practiced.

SUMMARY

Embodiments described herein relate to a bidirectional current sense circuit that allows for sensing of a power current that passes through a power field-effect transistor, regardless of the direction of flow of the power current. The bidirectional current sense circuit outputs a current sense signal, representing the power current, onto a current sense output node. For purposes of clarity, when the power current flows from the drain node to the source node of the power transistor, the current is defined as flowing in the "positive direction". On the other hand, when the power current flows from the source node to the drain node of the power transistor, the current is defined as flowing in the "negative direction".

The bidirectional current sense circuit includes the power field-effect transistor, and two current sense circuits. One of the current sense circuits is used to sense the power current when the power current flows in the positive direction, and thus will sometimes be referred to herein as the "positive" current sense circuit. On the other hand, the other current sense circuit is used to sense the power current when the power current flows in the negative direction, and thus will sometimes be referred to herein as the "negative" current sense circuit.

Each of the positive current sense circuit and the negative current sense circuit includes a sense transistor, an operational amplifier, a variable current source, and a mirroring current source. Each of the sense transistors may be a miniaturized version of the power transistor. For purposes of clarity, the elements of the positive current sense circuit will be referred to as "first" elements, and the elements of the negative current sense circuit will be referred to as "second" elements. The exact connections between the elements of the bidirectional current sense circuit will be described in greater detail in the detailed description section. However, a brief explanation of the functionality of the bidirectional current sense circuit will now be described.

When the power current flows in the positive direction, the first operational amplifier causes the first variable current source to output a first sense current to the drain node of the first sense transistor. The first sense current is proportional to the power current while the power current flows in the positive direction. The first mirroring current source mirrors the first sense current, and outputs a first mirrored current towards the current sense output node. Accordingly, when the power current flows in the positive direction, the first mirrored current may be used to generate the current sense signal (representing the power current) on the current sense output node.

On the other hand, when the power current flows in the negative direction, the second operational amplifier causes the second variable current source to output a second sense current to the source node of the second sense transistor. The second sense current is proportional to the power current while the power current flows in the negative direction. The second mirroring current source mirrors the second sense current, and draws a second mirrored current away from the current sense output node. Accordingly, when the power current flows in the negative direction, the second mirrored current may be used to generate the current sense signal (representing the power current) on the current sense output node.

Accordingly, the bidirectional current sense circuit allows for sensing of the power current passing through the power field-effect transistor, regardless of the direction that the power current flows through the power field-effect transistor.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the advantages and features of the circuits, systems, and methods described herein can be obtained, a more particular description of the embodiments briefly described herein will be rendered by reference to specific embodiments thereof which are illustrated in the appended drawings. Understanding that these drawings depict only typical embodiments of the circuits, systems and methods described herein, and are not therefore to be considered to be limiting of their scope, certain circuits, systems and methods will be described and explained with additional specificity and detail through the use of the accompanying drawings in which.

DETAILED DESCRIPTION

Embodiments described herein relate to a bidirectional current sense circuit that allows for sensing of a power current that passes through a power field-effect transistor, regardless of the direction of flow of the power current. The bidirectional current sense circuit outputs a current sense signal, representing the power current, onto a current sense output node. For purposes of clarity, when the power current flows from the drain node to the source node of the power transistor, the current is defined as flowing in the "positive direction". On the other hand, when the power current flows from the source node to the drain node of the power transistor, the current is defined as flowing in the "negative direction".

The bidirectional current sense circuit includes the power field-effect transistor, and two current sense circuits. One of the current sense circuits is used to sense the power current when the power current flows in the positive direction, and thus will sometimes be referred to herein as the "positive" current sense circuit. On the other hand, the other current sense circuit is used to sense the power current when the power current flows in the negative direction, and thus will sometimes be referred to herein as the "negative" current sense circuit.

Each of the positive current sense circuit and the negative current sense circuit includes a sense transistor, an operational amplifier, a variable current source, and a mirroring current source. Each of the sense transistors may be a miniaturized version of the power transistor.

Figure 1:
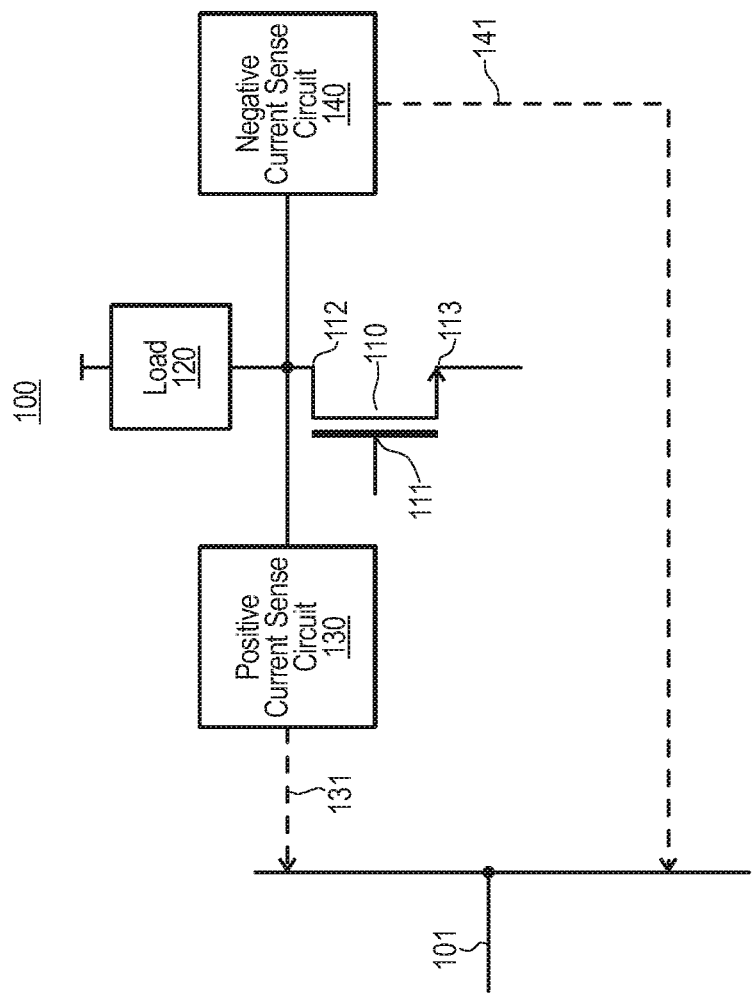
FIG. 1 illustrates a bidirectional current sense circuit in which the principles described herein may be practiced, and is just one example of a bidirectional current sense circuit that is consistent with the principles described herein.

FIG. 1 illustrates a bidirectional current sense circuit 100 in which the principles described herein may be practiced, and is just one example of a bidirectional current sense circuit that is consistent with the principles described herein.

The bidirectional current sense circuit 100 allows for sensing of a power current that passes through a power field-effect transistor 110, regardless of the direction of the flow of the power current. The bidirectional current sense circuit 100 outputs a current sense signal representing the power current onto a current sense output node 101. As an example only, the power field-effect transistor 110 may be a Gallium-Nitride (GaN) field-effect transistor.

The power field-effect transistor 110 has a gate node 111 that controls whether current flows between a drain node 112 and a source node 113 of the power field-effect transistor. A load 120 may be connected to the drain node 112 of the power field-effect transistor 110, and may bidirectionally provide the power current through the power field-effect transistor 110. For purposes of clarity, when the power current flows from the drain node 112 to the source node 113 of the power field-effect transistor 110, the power current is defined as flowing in the "positive direction". On the other hand, when the power current flows from the source node 113 to the drain node 112 of the power field-effect transistor 110, the power current is defined as flowing in the "negative direction". For purposes of brevity, the power field-effect transistor 110 may sometimes be referred to herein simply as the "power transistor 110".

The bidirectional current sense circuit 100 further includes two current sense circuits 130 and 140. The current sense circuit 130 is used to sense the power current when the power current flows in the positive direction, and thus will sometimes be referred to herein as the "positive" current sense circuit 130. On the other hand, the current sense circuit 140 is used to sense the power current when the power current flows in the negative direction, and thus will sometimes be referred to as the "negative" current sense circuit 140. For illustrative purposes only, the positive current sense circuit 130 and the negative current sense circuit 140 are shown in FIG. 1 as being connected to the drain node 112 of the power transistor 110. However, the exact connections between the power transistor 110, the positive current sense circuit 130 and the negative current sense circuit 140 will be shown in greater detail with respect to FIG. 2.

When the power current flows through the power transistor 110 in the positive direction, the positive current sense circuit 130 outputs a current signal 131 (as represented by the dashed arrow labelled "131") to the current sense output node 101. The current signal 131 is representative of the power current when the power current is positive. Thus, the current signal 131 may be used to generate the current sense signal (representing the power current) on the current sense output node 101 when the power current is positive.

On the other hand, when the power current flows through the power transistor 110 in the negative direction, the negative current sense circuit 140 outputs a current signal 141 (as represented by the dashed arrow labelled "141") to the current sense output node 101. The current signal 141 is representative of the power current when the power current is negative. Thus, the current signal 141 may be used to generate the current sense signal (representing the power current) on the current sense output node 101 when the power current is negative.

Accordingly, the bidirectional current sense circuit 100 generates a current sense signal, representing the power current passing through the power transistor 110, on the current sense output node 101, regardless of the direction that the power current flows through the power transistor 110.

Figure 2:
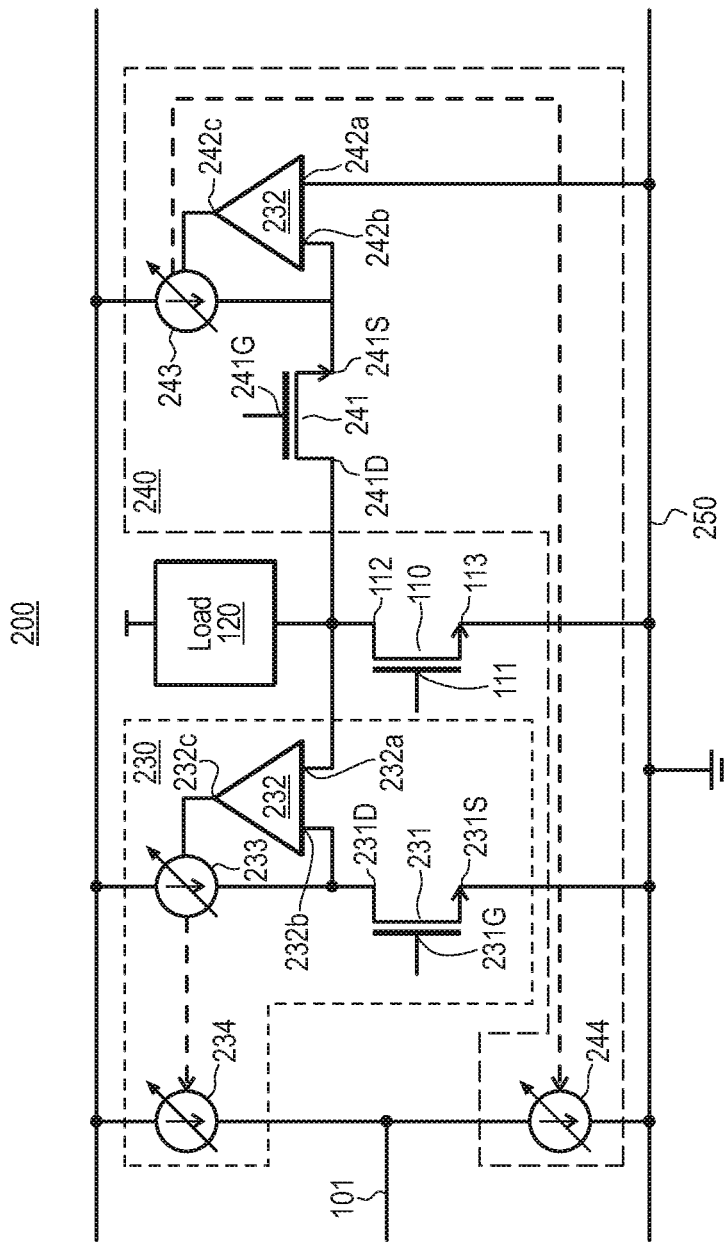
FIG. 2 illustrates a bidirectional current sense circuit, which is an example of the bidirectional current sense circuit of FIG. 1, but with examples of the positive current sense circuit and the negative current sense circuit shown in greater detail.

FIG. 2 illustrates a bidirectional current sense circuit 200, which is an example of the bidirectional current sense circuit 100 of FIG. 1, but with examples of the positive current sense circuit 130 and the negative current sense circuit 140 shown in greater detail. For purposes of simplicity, the power field-effect transistor 110 and the load 120 are illustrated in FIG. 2 using the same element numbers as in FIG. 1. Further, the bidirectional current sense circuit 200 includes a positive current sense circuit 230 and a negative current sense circuit 240, which are respective examples of the positive current sense circuit 130 and the negative current sense circuit 140 of FIG. 1.

The positive current sense circuit 230 includes a sense field-effect transistor 231, an operational amplifier 232, a variable current source 233 and a mirroring current source 234. For clarity, the elements of the positive current sense circuit 230 are illustrated in FIG. 2 encompassed by a dotted-line box. For purposes of simplicity, the sense field-effect transistor 231 may sometimes be referred to herein simply as the "sense transistor 231". The sense transistor 231 may be a miniaturized version of the power transistor 110. That is, the sense transistor 231 may be identical to the power transistor 110, except that the sense transistor 231 has a channel width that is, for example, 500 times smaller than the channel width of the power transistor 110. Further, the sense transistor 231 may be formed on a same epitaxial stack as the power transistor 110. In this case, the on-resistance of the sense transistor 231 would be 500 times larger than the on-resistance of the power transistor 110.

The sense transistor 231 has a gate node 231G that controls whether current flows between its drain node 231D and its source node 231S. While not explicitly shown in FIG. 2, the gate node 231G of the sense transistor 231 is connected to the gate node 111 of the power transistor 110. Further, the source node 231S of the sense transistor 231 and the source node 113 of the power transistor 110 are each connected to a reference voltage source 250 (e.g., providing ground).

The operational amplifier 232 has an input node 232a connected to the drain node 112 of the power transistor 110, and has an input node 232b connected to the drain node 231D of the sense transistor 231. The variable current source 233 provides a variable amount of current to the drain node 231D of the sense transistor 231. The variable amount of current provided by the variable current source 233 is dependent on an output signal on an output node 232c of the operational amplifier 232, and is proportional to the power current when the power current is positive. This is because when the power current is positive, the operational amplifier 232 and the variable current source 233 work together to cause the voltage at the drain node 231D of the sense transistor 231 to be approximately the same as the voltage at the drain node 112 of the power transistor 110, as will be explained later. The variable current source 233 interacts with the mirroring current source 234 (e.g., via a current mirror, represented by the dashed-line arrow), such that the mirroring current source 234 mirrors the variable amount of current provided by the variable current source 233. Thus, the mirroring current source 234 provides a mirrored current towards the current sense output node. That mirrored current is approximately equal to (or at least proportional to) the varying current from the varying current source 233.

The negative current sense circuit 240 also includes a sense field-effect transistor 241, an operational amplifier 242, a variable current source 243 and a mirroring current source 244. For clarity, the elements of the negative current sense circuit 240 are illustrated in FIG. 2 encompassed by a dashed-line box. For purposes of simplicity, the sense field-effect transistor 241 may sometimes be referred to herein simply as the "sense transistor 241". The sense transistor 241 may also be a miniaturized version of the power transistor 110. That is, the sense transistor 241 may be identical to the power transistor 110, except that the sense transistor 241 has a channel width that is, for example, 500 times smaller than the channel width of the power transistor 110. Further, the sense transistor 241 may be formed on the same epitaxial stack as the power transistor 110. In this case, the on-resistance of the sense transistor 241 would be 500 times larger than the on-resistance of the power transistor 110.

The sense transistor 241 has a gate node 241G that controls whether current flows between its drain node 241D and its source node 241S. While not explicitly shown in FIG. 2, the gate node 241G of the sense transistor 241 is also connected to the gate node 111 of the power transistor 110. Further, the drain node 241D of the sense transistor 241 is connected to the drain node 112 of the power transistor 110.

The operational amplifier 242 has an input node 242a connected to the reference voltage source 250, and has an input node 242b connected to the source node 241S of the sense transistor 241. The variable current source 243 provides a variable amount of current to the source node 241S of the sense transistor 241. The variable amount of current provided by the variable current source 243 is dependent on an output signal on an output node 242c of the operational amplifier 242, and is proportional to the power current when the power current is negative. This is because when the power current is negative, the operational amplifier 242 and the variable current source 243 work together to cause the voltage at the source node 241S of the sense transistor 241 to be approximately equal to the voltage provided by the reference voltage source (e.g., ground), as will be explained later. The variable current source 243 interacts with the mirroring current source 244 (e.g., via a current mirror, represented by the dotted-line arrow), such that the mirroring current source 244 mirrors the variable amount of current provided by the variable current source 243. Thus, the mirroring current source 244 draws a mirrored current away from the current sense output node 101. That mirrored current is approximately equal to (or at least proportional to) the varying current from the varying current source 243.

In operation, suppose that a gate voltage (e.g., positive 6 volts) is applied to the connected gate nodes of each of the power transistor 110 and the sense transistors 231 and 241. Further, suppose that the power current passing through the power transistor 110 is positive (i.e., current flows from the drain node 112 to the source node 113). In this case, due to the on-resistance of the power transistor 110, a positive voltage (e.g., single digits of volts) is induced at the drain node 112 of the power transistor 110 as compared to the reference voltage source 250 (e.g., which will be taken as ground in the further discussion). In this case, the operational amplifier 232 and the variable current source 233 jointly function as a feedback circuit that brings the voltage at the drain node 231D of the sense transistor 231 to be approximately equal to the voltage at the drain node 112 of the power transistor 110.

For example, if the drain voltage at the drain node 231D of the sense transistor 231 was slightly above the drain voltage at the drain node 111 of the power transistor 110, the output signal from the operational amplifier 232 would cause the variable current source 233 to reduce the amount of current it provides to the drain node 231D of the sense transistor 231. Since the on-resistance of the sense transistor 231 is relatively constant, thus adjustment would reduce the drain voltage on the drain node 231D of the sense transistor 231. On the hand, if the drain voltage at the drain node 231D of the sense transistor 231 was slightly below the drain voltage at the drain node 112 of the power transistor 110, the output signal from the operational amplifier 232 would cause the variable current source 233 to increase the amount of current it provides to the drain node 231D of the sense transistor 231, thereby causing the drain voltage on the drain node 231D of the sense transistor 231 to likewise increase. Thus, the feedback loop provided by the operational amplifier 232 and the variable current source 233 stabilizes the drain voltage at the drain node 231D of the sense transistor 231 to be approximately at the drain voltage of the power transistor 110.

Accordingly, while the power current is positive, each of the power transistor 110 and the sense transistor 231 operate under approximately the same conditions. That is, each of the power transistor 110 and the sense transistor 231 have the same voltages applied to their respective gate nodes (e.g., positive 6 volts), drain nodes (e.g., single digits of volts) and source nodes (e.g., ground). Further, recall that the sense transistor 231 is a miniaturized replica of the power transistor 110, having for example, 500 times the on-resistance of the power transistor 110. Thus, while the power current is positive, the current passing through the sense transistor 231 is proportional to the power current passing through the power transistor 110. More specifically, the current passing through the sense transistor 231, which is provided by the variable current source 233, is equal to the power current times the ratio of the on-resistance of the power transistor 110 over the on-resistance of the sense transistor 231. In other words, if the channel width of the sense transistor 231 was 500 times smaller than the channel width of the power transistor 110, the sense current through the sense transistor 231 would be proportional to (and 500 times smaller than) the current passing through the power transistor 110.

The mirroring current source 234 mirrors the current provided by the variable current source 233. Thus, the mirroring current source 234 provides a mirrored current of (that is approximately equal to) the current provided by the variable current source 233, towards the current sense output node 101. This mirrored current (being a positive current signal) may then itself be the current sense signal on the current sense output node 101, or may be used to generate the current sense signal on the current sense output node 101, as will be explained further below with respect to FIG. 3.

For example, in the case of the sense transistor 231 having a channel width that is 500 times smaller than the channel width of the power transistor 110, the current passing through the sense transistor 231 would be approximately 500 times smaller than the power current. In the case of the mirroring current source 234 providing a mirrored current that is equal to the current provided by the variable current source 233, the mirrored current would also be approximately 500 times smaller than the power current. Thus, if the mirrored current was the current sense signal on the current sense output node 101, that current sense signal would also be 500 times smaller than the power current.

However, the principles described herein are not limited to the proportionality between the current passing through the sense transistor 231 and the power current, are not limited to the mirroring current source 234 mirroring exactly the current provided by the variable current source 233, and are not limited to the target proportionality between the current sense signal on the current sense output node 101 and the power current. For example, suppose that the target was to have a current sense signal on the current sense output node 101 that is 500 times smaller than the power current. This could also be achieved, for example, by using a sense transistor 231 that has a channel width that is 1000 times smaller than the channel width of the power transistor 110, and by then using a mirroring current source 234 that provides a mirrored current that is two times the current provided by the variable current source 233. As an alternative example, this could be achieved by using a sense transistor 231 that has a channel width that is 5000 times smaller than the channel width of the power transistor 110, and then by using a mirroring current source 234 that provides a mirrored current that is ten times the current provided by the variable current source 233.

In any case, when the power current is positive, the positive current sense circuit 230 is used to generate the current sense signal, representing the power current, on the current sense output node 101.

Suppose now that the power current passing through the power transistor 110 is negative (e.g., current flows from the source node 113 to the drain node 112). In this case, due to the on-resistance of the power transistor 110, a negative voltage (e.g., single digits of negative volts) is induced at the drain node 112 of the power transistor 110. When the voltage at the drain node 112 is negative, the positive current sense circuit 230 becomes nonfunctional. This is because, in order to induce a negative voltage at the drain node 231D of the sense transistor 231, the variable current source 233 would have to provide a negative current to the drain node 231D of the sense transistor 231. However, the variable current source 233 can only provide a minimum of zero amps of current, and thus cannot provide a negative current. Thus, in this case, no current is provided by the variable current source 233, and thus no current is provided to the current sense output node 101 via the mirroring current source 234.

However, when the power current is negative, and thus the voltage at the drain node 241D of the sense transistor 241 is negative, current is allowed to flow from the source node 241S to the drain node 241D of the sense transistor 241. Thus, in this case, the operational amplifier 242 and the variable current source 243 jointly function as a feedback circuit that brings the voltage at the source node 241S to be approximately equal to the reference voltage (e.g., ground) provided by the reference voltage source 250.

For example, if the source voltage at the source node 241S of the sense transistor 241 was slightly above the reference voltage (e.g., ground) at the reference voltage source 250, the output signal from the operational amplifier 242 would cause the variable current source 243 to reduce the amount of current it provides to the source node 241S of the sense transistor 241, thereby causing the source voltage on the source node 241S of the sense transistor 241 to likewise decrease. On the other hand, if the source voltage at the source node 241S of the sense transistor 241 was slightly below the reference voltage provided by the reference voltage source 250, the output signal from the operational amplifier 242 would cause the variable current source 233 to increase the amount of current it provides to the source node 241S of the sense transistor 241, thereby causing the source voltage on the source node 241S of the sense transistor 241 to likewise increase. Thus, the feedback loop provided by the operational amplifier 242 and the variable current source 243 stabilizes the source voltage at the source node 241S of the sense transistor 241 to be approximately at the reference voltage provided by the reference voltage source 250.

Accordingly, while the power current is negative, each of the power transistor 110 and the sense transistor 241 operate under the same conditions. That is, each of the power transistor 110 and the sense transistor 241 have the same voltages applied to their respective gate nodes (e.g., positive 6 volts), drain nodes (e.g., negative single digits of volts) and source nodes (e.g., ground). Further, recall that the sense transistor 241 is also a miniaturized replica of the power transistor 110, having for example, 500 times the on-resistance of the power transistor 110. Thus, while the power current is negative, the current passing through the sense transistor 241 is proportional to the power current passing through the power transistor 110. More specifically, the current passing through the sense transistor 241, which is provided by the variable current source 243, is equal to the power current times the ratio of the on-resistance of the power transistor 110 over the on-resistance of the sense transistor 241. In other words, if the channel width of the sense transistor 241 was 500 times smaller than the channel width of the power transistor 110, the sense current through the sense transistor 241 would be proportional to (and 500 times smaller than) the current passing through the power transistor 110.

The mirroring current source 244 mirrors the current provided by the variable current source 243. Thus, the mirroring current source 244 draws a mirrored current away from the current sense output node 101, where that mirrored current is approximately equal to the current provided by the variable current source 243. This mirrored current (being a negative current signal) may then itself be the current sense signal on the current sense output node 101, or may be used to generate the current sense signal on the current sense output node as will be explained later with respect to FIG. 3.

For example, in the case of the sense transistor 241 having a channel width that is 500 times smaller than the channel width of the power transistor 110, the current passing through the sense transistor 241 would be approximately 500 times smaller than the power current. In the case of the mirroring current source 244 drawing a mirrored current that is equal to the current provided by the variable current source 243, the mirrored current would then also be approximately 500 times smaller than the power current. Thus, if the mirrored current was the current sense signal on the current sense output node 101, that current sense signal would also be 500 times smaller than the power current.

However, like on positive current sense circuit 230, the principles of operation of the negative current sense circuit 240 are not limited to the proportionality between the current passing through the sense transistor 241 and the power current, are not limited to the mirroring current source 244 mirroring exactly the current provided by the variable current source 243, and are not limited to the target proportionality between the current sense signal on the current sense output node 101 and the power current. However, in one embodiment, the target proportionality may be the same regardless of the whether the power current passing through the power transistor 110 is positive or negative. In any case, when the power current is negative, the negative current sense circuit 240 is used to generate (on the current sense output node 101) the current sense signal that represents the power current.

Recall that when the power current passing through the power transistor 110 is negative, the positive current sense circuit 230 does not function to provide a current to the current sense output node 101. On the other hand, when the power current passing through the power transistor 110 is positive, the negative current sense circuit 240 does no draw a current from the current sense output node 101. This is because the variable current source 243 cannot provide a negative current to the source node 241S of the sense transistor 241. Thus, when the power current is positive, no current is provided by the variable current source 243, and thus no current is drawn away from the current sense output node 101 via the mirroring current source 244.

Accordingly, the bidirectional current sense circuit 200 allows for the generation of a current sense signal, representing the power current, on the current sense output node 101, regardless of the direction that the power current flows through the power transistor 110.

Figure 3:
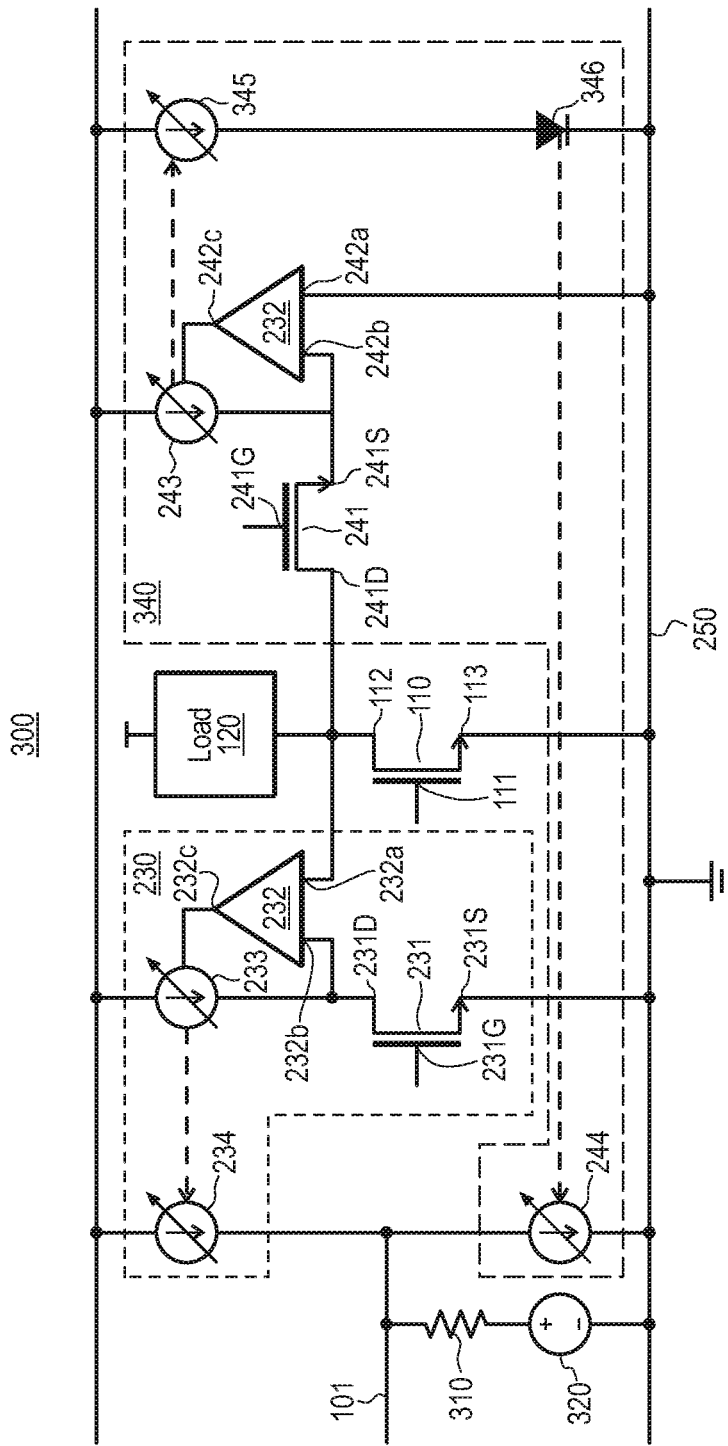
FIG. 3 illustrates a bidirectional current sense circuit, which is an example of the bidirectional current sense circuit of FIG. 2, but with several additional components.

In some embodiments, the current sense signal on the current sense output node 101 may be a voltage signal instead of a current signal. FIG. 3 illustrates a bidirectional current sense circuit 300, which is an example of the bidirectional current sense circuit 200 of FIG. 2, but with the addition of a current sense resistor 310. The current sense resistor 310 is used to convert mirrored currents, provided by the mirroring current source 234 and the mirrored current source 244, into voltage signals on the current sense output node 101.

That is, when the power current is positive, the mirroring current source 234 provides a mirrored current, proportional to the power current, toward the current sense output node 101. That mirrored current is passed through the current sense resistor 310, and a positive voltage signal, representing the power current, is induced on the current sense output node 101. On the other hand, when the power current is negative, the mirroring current source 244 draws a mirrored current, proportional to the power current, away from the current sense output node 101. That mirrored current is passed through the current sense resistor 310, and a negative voltage signal, representing the power current, may be induced on the current sense output node 101.

However, for ease of reading of the voltage signal (i.e., the current sense signal) on the current sense output node 101 by a device that may be connected to the current sense output node, the bidirectional current sense circuit 300 also includes a voltage-shift voltage source 320. The voltage-shift voltage source 320 shifts up all voltage signals on the current sense output node 101 to be positive. For example, the voltage-shift voltage source 320 could provide positive 5 volts. Thus, if the power current was zero, the voltage signal on the current sense output node 101 would be at approximately positive 5 volts. If the power current was positive, the voltage signal on the current sense output node 101 could range, for example, from approximately positive 5 volts to positive 9 volts. On the other hand, if the power current was negative, the voltage signal on the current sense output node 101 could range, for example, from positive 1 volt to approximately positive 5 volts. However, the principles described herein are not limited to the voltage provided by the voltage-shift voltage source 320, are not limited to the current sense signal on the current sense output node 101 being particularly a voltage signal or a current signal, and are not limited to the range of any voltage signals or current signals on the current sense output node 101.

Further, the bidirectional current sense circuit 300 of FIG. 3 includes a negative current sense circuit 340, which is an example of the negative current sense circuit 240 of FIG. 2, but which includes additional components that may assist in proper current mirroring. For purposes of simplicity, the like elements of the negative current sense circuit 240 of FIG. 2 are labelled in the negative current sense circuit 340 of FIG. 3 using the same element numbers.

The negative current sense circuit 340 further includes an intermediate mirror current source 345 and a diode 346. As an example only, the diode 346 may be a diode-connected transistor. When the power current is negative, the variable current source 243 outputs the variable amount of current, as previously described with respect to FIG. 2. However, in FIG. 3, the intermediate mirror current source 345 mirrors the current provided by the variable current source 243, and outputs an intermediate mirrored current (that is approximately equal to the current from the variable current source 243) through the diode 346. The mirroring current source 244 then mirrors the current passing through the diode 346. In this way, the mirroring current source 244 draws the mirrored current away from the current sense output node 101, where the mirrored current is approximately equal to the current provided by the variable current source 243.

Accordingly, the bidirectional circuit according to the principles described herein is capable of generating a current sense signal (which could be a voltage signal or a current signal), representing the power current, on the current sense output node 101, regardless of the direction of the power current. The bidirectional current sense circuit 300 is also capable of manipulating that current sense signal so as to be more easily readable by a device that may be connected to the current sense output node 101.

Literal Support Section

Clause 1. A bidirectional current sense circuit configured to output a current sense signal on a current sense output node, the current sense signal indicating a power current passing through a power field-effect transistor, the bidirectional current sense circuit comprising: the power field-effect transistor, a source node of the power field-effect transistor connected to a reference voltage source; a first sense field-effect transistor, a gate node of the first sense field-effect transistor connected to a gate node of the power field-effect transistor, a source node of the first sense field-effect transistor also connected to the reference voltage source; a first operational amplifier having a first input node connected to a drain node of the power field-effect transistor, and having a second input node connected to a drain node of the first sense field-effect transistor; a first variable current source configured to provide a variable amount of current to the drain node of the first sense field-effect transistor responsive to a signal on an output node of the first operational amplifier; a first mirroring current source configured to mirror current provided by the first variable current source and output first mirrored current towards the current sense output node; a second sense field-effect transistor, a gate node of the second sense field-effect transistor connected to the gate node of the power field-effect transistor, a drain node of the second sense field-effect transistor connected to the drain node of the power field-effect transistor; a second operational amplifier having a first input node connected to the reference voltage source, and having a second input node connected to a source node of the second sense field-effect transistor; a second variable current source configured to provide a variable amount of current to the source node of the second sense field-effect transistor responsive to a signal on an output node of the second operational amplifier; and a second mirror current source configured to mirror current provided by the second variable current source and draw second mirrored current away from the current sense output node.

Clause 2. The bidirectional current sense circuit according to Clause 1, the bidirectional current sense circuit further comprising a current sense resistor coupled between the reference voltage source and the current sense output node.

Clause 3. The bidirectional current sense circuit according to Clause 2, the bidirectional current sense circuit further comprising a voltage-shift voltage source having a negative terminal connected to the reference voltage source, and having a positive terminal connected to the current sense resistor, such that the current sense resistor is connected in series with the voltage-shift voltage source between the reference voltage source and the current sense output node.

Clause 4. The bidirectional current sense circuit according to Clause 1, the bidirectional current sense circuit further comprising: an intermediate mirror current source configured to mirror current provided by the second variable current source and configured to output intermediate mirrored current; and a diode connected between the intermediate mirror current source and the reference voltage source, the diode being forward-biased from the intermediate mirror current source towards the reference voltage source, such that the intermediate mirrored current is provided to an anode of the diode, the second mirror current source being configured to mirror current provided by the second variable current source by mirroring the intermediate mirrored current passing through the diode.

Clause 5. The bidirectional current sense circuit according to Clause 4, the diode being a diode-connected field-effect transistor.

Clause 6. The bidirectional current sense circuit according to Clause 5, each of the power field-effect transistor, the first sense field-effect transistor, the second sense field-effect transistor, and the diode-connected field-effect transistor being Gallium-Nitride (GaN) transistors.

Clause 7. The bidirectional current sense circuit according to Clause 1, each of the power field-effect transistor, the first sense field-effect transistor and the second sense field-effect transistor being Gallium-Nitride transistors.

Clause 8. The bidirectional current sense circuit according to Clause 1, each of the power field-effect transistor, the first sense field-effect transistor and the second sense field-effect transistor being formed at least in part on portions of a same epitaxial stack.

Clause 9. The bidirectional current sense circuit according to Clause 1, the reference voltage source providing ground.

Clause 10. The bidirectional current sense circuit according to Clause 1, the bidirectional current sense circuit further comprising a load connected to the drain node of the power field-effect transistor, the load being configured to bidirectionally provide the power current through the power field-effect transistor.

Clause 11. The bidirectional current sense circuit according to Clause 10, wherein when the load provides the power current from the drain node of the power field-effect transistor to the source node of the power field-effect transistor, the current sense signal on the current sense output node is generated, at least in part, by the first mirrored current, and when the load provides the current from the source node of the power field-effect transistor to the drain node of the power field-effect transistor, the current sense signal on the current sense output node is generated, at least in part, by the second mirrored current. Invention 2: Slide 12

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed is:

1. A bidirectional current sense circuit configured to output a current sense signal on a current sense output node, the current sense signal indicating a power current passing through a power field-effect transistor, the bidirectional current sense circuit comprising:
    the power field-effect transistor, a source node of the power field-effect transistor connected to a reference voltage source;
    a first sense field-effect transistor, a gate node of the first sense field-effect transistor connected to a gate node of the power field-effect transistor, a source node of the first sense field-effect transistor also connected to the reference voltage source;
    a first operational amplifier having a first input node connected to a drain node of the power field-effect transistor, and having a second input node connected to a drain node of the first sense field-effect transistor;
    a first variable current source configured to provide a variable amount of current to the drain node of the first sense field-effect transistor responsive to a signal on an output node of the first operational amplifier;
    a first mirroring current source configured to mirror current provided by the first variable current source and output first mirrored current towards the current sense output node;
    a second sense field-effect transistor, a gate node of the second sense field-effect transistor connected to the gate node of the power field-effect transistor, a drain node of the second sense field-effect transistor connected to the drain node of the power field-effect transistor;
    a second operational amplifier having a first input node connected to the reference voltage source, and having a second input node connected to a source node of the second sense field-effect transistor;
    a second variable current source configured to provide a variable amount of current to the source node of the second sense field-effect transistor responsive to a signal on an output node of the second operational amplifier; and
    a second mirror current source configured to mirror current provided by the second variable current source and draw second mirrored current away from the current sense output node.

2. The bidirectional current sense circuit according to claim 1, the bidirectional current sense circuit further comprising a current sense resistor coupled between the reference voltage source and the current sense output node.

3. The bidirectional current sense circuit according to claim 2, the bidirectional current sense circuit further comprising a voltage-shift voltage source having a negative terminal connected to the reference voltage source, and having a positive terminal connected to the current sense resistor, such that the current sense resistor is connected in series with the voltage-shift voltage source between the reference voltage source and the current sense output node.

4. The bidirectional current sense circuit according to claim 1, the bidirectional current sense circuit further comprising:
    an intermediate mirror current source configured to mirror current provided by the second variable current source and configured to output intermediate mirrored current; and
    a diode connected between the intermediate mirror current source and the reference voltage source, the diode being forward-biased from the intermediate mirror current source towards the reference voltage source, such that the intermediate mirrored current is provided to an anode of the diode,
    the second mirror current source being configured to mirror current provided by the second variable current source by mirroring the intermediate mirrored current passing through the diode.

5. The bidirectional current sense circuit according to claim 4, the diode being a diode-connected field-effect transistor.

6. The bidirectional current sense circuit according to claim 5, each of the power field-effect transistor, the first sense field-effect transistor, the second sense field-effect transistor, and the diode-connected field-effect transistor being Gallium-Nitride (GaN) transistors.

7. The bidirectional current sense circuit according to claim 1, each of the power field-effect transistor, the first sense field-effect transistor and the second sense field-effect transistor being Gallium-Nitride transistors.

8. The bidirectional current sense circuit according to claim 1, each of the power field-effect transistor, the first sense field-effect transistor and the second sense field-effect transistor being formed at least in part on portions of a same epitaxial stack.

9. The bidirectional current sense circuit according to claim 1, the reference voltage source providing ground.

10. The bidirectional current sense circuit according to claim 1, the bidirectional current sense circuit further comprising a load connected to the drain node of the power field-effect transistor, the load being configured to bidirectionally provide the power current through the power field-effect transistor.

11. The bidirectional current sense circuit according to claim 10, wherein
    when the load provides the power current from the drain node of the power field-effect transistor to the source node of the power field-effect transistor, the current sense signal on the current sense output node is generated, at least in part, by the first mirrored current, and
    when the load provides the current from the source node of the power field-effect transistor to the drain node of the power field-effect transistor, the current sense signal on the current sense output node is generated, at least in part, by the second mirrored current.

* * * * *